US 7,079,069 B2

(12) United States Patent
Hammerschmidt et al.

(10) Patent No.: US 7,079,069 B2
(45) Date of Patent: Jul. 18, 2006

(54) ANALOG-DIGITAL CONVERTER AND METHOD FOR ANALOG-DIGITAL CONVERTING

(75) Inventors: Dirk Hammerschmidt, Villach (AT); Wolfgang Scherr, Landskron (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/955,077

(22) Filed: Sep. 30, 2004

(65) Prior Publication Data

US 2005/0122247 A1    Jun. 9, 2005

(30) Foreign Application Priority Data

Sep. 30, 2003   (DE) ................. 103 45 459

(51) Int. Cl.
*H03M 1/12*    (2006.01)
(52) U.S. Cl. ................. 341/155; 341/161
(58) Field of Classification Search ............. 341/118, 341/155–165
See application file for complete search history.

(56) References Cited

U.S. PATENT DOCUMENTS 5,394,147 A    2/1995   Miyake ............... 341/161
6,456,211 B1*  9/2002   Wu et al. ............. 341/155

FOREIGN PATENT DOCUMENTS

DE    43 11 548 A1    12/1993
JP    11154866 A      6/1999

* cited by examiner

*Primary Examiner*—Lam T. Mai
(74) *Attorney, Agent, or Firm*—Baker Botts L.L.P.

(57) ABSTRACT

An analog-digital converter has a first register for holding a first approximation number which is variable in a first cycle and is fixed in a second cycle, as well as a second register for holding a second approximation number which is fixed in the first cycle and is variable in the second cycle. Further, the analog-digital converter has an adder for adding the first and second approximation numbers and for providing a sum approximation number representing a digital representation of an analog input signal. A processor is formed to calculate the first approximation number and the second approximation number. Further, the analog-digital converter has a controller for operating the processor in the first or second cycle.

12 Claims, 6 Drawing Sheets

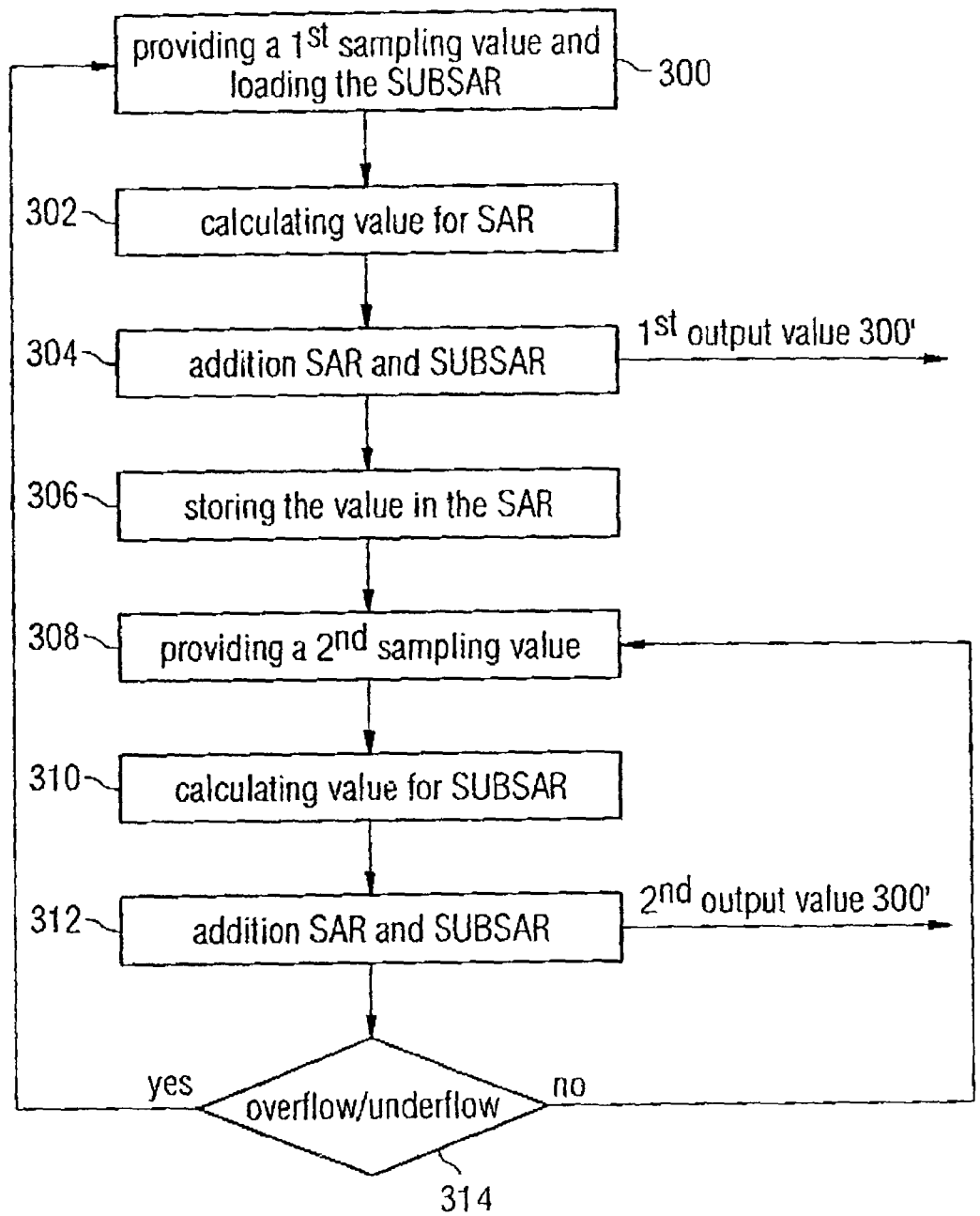

US 7,079,069 B2

ANALOG-DIGITAL CONVERTER AND METHOD FOR ANALOG-DIGITAL CONVERTING

PRIORITY

This application claims priority from German Patent Application No. 10345459.4, which was filed on Sep. 30, 2003, and is incorporated herein by reference in its entirety.

1. Field of the Invention

The present invention relates to an analog-digital converter and, particularly, to an analog-digital converter with a sub-range conversion and a method for analog-digital conversion.

2. Description of the Related Art

An analog-digital converter (ADC) converts an analog input signal, particularly electric voltage or electric current, to a digital output signal. The digital output signal represents a number that is proportional to the current magnitude and/or amplitude of the analog input signal. ADCs are used in some areas of electronics in which analog input signals are digitally stored, processed or transmitted.

FIG. 5 shows an ADC based on a SAR method, as commonly employed in a tire pressure sensor system. An ADC in accordance with the SAR method comprises a SAR register 102, a digital-analog converter 104 and a comparator 106. The ADC is formed to convert an analog input signal 120 to a digital output signal 122.

The shown ADC is based on a method of successive approximation (SAR; SAR=successive approximation register). In the SAR method, the digital output signal 122 corresponding to the analog input signal 120 is determined by interval-sharing. Starting with a most significant bit, the SAR register 102 sets each bit of an approximation number 130 held in the SAR register 102 on a trial basis one after the other down to a least significant bit. After each setting of a bit, the approximation number 130 is converted to an analog approximation signal 138 corresponding to the approximation number 130 by the digital-analog converter 104. This is necessary to make it possible to compare the approximation number 130 with the analog input signal 120. The comparator 106 compares the analog input signal 120 with the analog approximation signal 138 and provides a result 140 of the comparison to the SAR register 102. If the analog input signal 120 is larger than the analog approximation signal 138, the last set bit of the approximation number 130 remains set in the SAR register 102. Otherwise, the bit is reset. When all bits of the approximation number 130, which in this case is a binary number with n binary positions, have been set once and, if necessary, have been reset, the approximation number 130 corresponds to a digital representation of the analog input signal 120 and is output in the form of the digital output signal 122.

Control of the analog-digital conversion is performed via an SOC signal 142 (SOC=start of conversion) and an EOC signal 144 (EOC=end of conversion), which connect a controller (not shown) with the SAR register 102.

In applications such as a tire pressure sensor system, the analog input signal 120 normally only changes within a small range from one measuring value or sampling value to the next. In the shown embodiment, an input voltage $U_{IN}$ representing the analog input signal 120 changes within a voltage range marked $\epsilon$. Particularly when over-sampling is carried out for forming average values, the analog input signal 120 will very likely be within the interval $\epsilon$.

The shown ADC with a digital output signal 122 which is a binary number with n binary positions requires at least n conversion steps for determining the digital output signal 122 according to the SAR method by means of the described binary approximation according to the SAR method. In addition, an overhead o is required for the beginning of the analog-digital conversion which is controlled via the SOC signal 142, and/or the end of the conversion which is controlled via the EOC signal 144. For carrying out a series of measurements in which a number r of analog input signal values 130 is converted, (o+n)*r conversion steps are required according to the SAR method. This number of steps is also required in the case that the analog input values are statistically located within an epsilon environment $\epsilon$ relative to a set confidence interval. The width of the statistical interval $\epsilon$ has no influence on the converting time, which only depends on the number of the required converting steps which, in turn, is determined by the width n of the ADC.

A large number of required converting steps has an adverse effect on the converting time and on energy consumption required for the conversion. Particularly a high energy consumption is unfavorable for an application of the ADC in a tire pressure sensor system.

A significant reduction of energy consumption of an analog part of the ADC which, particularly in the case of high accuracy, has a high statistical current consumption, and a reduction of a dynamic energy consumption caused by signal changes may be achieved by a reduction of the conversion steps. For reducing the conversion steps, to date emphasis was substantially put on an optimal setting of the conversion range. This has the disadvantage that the application range of the ADC is highly restricted. Further, the analog circuit technology has focused intensively on a reduction of the current consumption and the number of averagings has correspondingly been held low. This, however, requires high quality of the components used for the ADC.

SUMMARY OF THE INVENTION

The object of the present invention is to provide an analog-digital converter, a method for analog-digital converting, a computer program for analog-digital converting and a tire pressure sensor that allow a fast and precise analog-digital conversion in a cost and energy-efficient manner.

In accordance with a first aspect, the present invention provides an analog-digital converter having a first register for holding a first approximation number which is variable in a first cycle and is fixed in a second cycle; a second register for holding a second approximation number which is fixed in the first cycle and is variable in the second cycle; an adder for adding the first and second approximation numbers and for providing a sum approximation number representing a digital representation of an analog input signal; a processor for calculating the first approximation number, the processor being formed to adjust the first approximation number in the first cycle in response to the analog input signal so that the sum approximation number depends on the analog input signal, and for calculating the second approximation number, the processor being formed to adjust the second approximation number in the second cycle in response to the analog input signal so that the sum approximation number depends on the analog input signal; and a controller for operating the processor in the first or second cycle.

In accordance with a second aspect, the present invention provides a tire pressure sensor having a unit for sensing a tire pressure and for providing an analog tire pressure sensing value; and an analog-digital converter for analog-digital converting the analog tire pressure sensing value to a digital tire pressure sensing value, the analog-digital converter having a first register for holding a first approximation number which is variable in a first cycle and is fixed in a second cycle; a second register for holding a second approximation number which is fixed in the first cycle and is variable in the second cycle; an adder for adding the first and second approximation numbers and for providing a sum approximation number representing a digital representation of an analog input signal; a processor for calculating the first approximation number, the processor being formed to adjust the first approximation number in the first cycle in response to the analog input signal so that the sum approximation number depends on the analog input signal, and for calculating the second approximation number, the processor being formed to adjust the second approximation number in the second cycle in response to the analog input signal so that the sum approximation number depends on the analog input signal; and a controller for operating the processor in the first or second cycle.

In accordance with a third aspect, the present invention provides a method for converting an analog input signal to a digital output signal, having the steps of providing a first sampling value of an analog input signal, and loading a first fixed value into a second register; calculating a first value of a first register so that a sum of the first values of the first and second registers depends on the analog input signal; forming a first sum of the first values of the first and second registers, and outputting the first sum as a first digital output signal; fixedly storing the first value of the first register in the first register; providing a second sampling value of the analog input signal; calculating a second value of the second register so that the sum of the first value of the second register and the second value of the second register depends on the analog input signal; forming a second sum of the first value of the first register and the second value of the second register depending on the analog input signal.

In accordance with a fourth aspect, the present invention provides a computer program with a program code for carrying out the method of converting an analog input signal to a digital output signal, when the computer program runs on a computer, the method having the steps of providing a first sampling value of an analog input signal, and loading a first fixed value into a second register; calculating a first value of a first register so that a sum of the first values of the first and second registers depends on the analog input signal; forming a first sum of the first values of the first and second registers, and outputting the first sum as a first digital output signal; fixedly storing the first value of the first register in the first register; providing a second sampling value of the analog input signal; calculating a second value of the second register so that the sum of the first value of the second register and the second value of the second register depends on the analog input signal; forming a second sum of the first value of the first register and the second value of the second register depending on the analog input signal.

In accordance with a fifth aspect, the present invention provides a hard-wired flow controller with corresponding logic and registers, or flow and/or calculating unit with fixed coding for carrying out the method of converting an analog input signal to a digital output signal, having the steps of providing a first sampling value of an analog input signal, and loading a first fixed value into a second register; calculating a first value of a first register so that a sum of the first values of the first and second registers depends on the analog input signal; forming a first sum of the first values of the first and second registers, and outputting the first sum as a first digital output signal; fixedly storing the first value of the first register in the first register; providing a second sampling value of the analog input signal; calculating a second value of the second register so that the sum of the first value of the second register and the second value of the second register depends on the analog input signal; forming a second sum of the first value of the first register and the second value of the second register depending on the analog input signal; when the method runs independently as hardware with or without direct further processing.

The present invention is based on the finding that a digital representation of an analog input signal value gained after a first analog-digital conversion may be used advantageously to convert analog input signal values following the first analog input signal in a time and energy-efficient manner without limiting conversion accuracy.

According to the present invention, an ADC based on the SAR method, in addition to means for carrying out the SAR method for a total conversion range of the ADC, comprises further means for carrying out a SUBSAR method for a conversion sub-range of the ADC. If a second input signal value to be converted is within a set interval around a first analog input signal value already converted, the conversion of the second analog input signal value does not have to take into account the total conversion range of the analog-digital converter, but it is sufficient to take into account a conversion sub-range whose size corresponds to the interval in which the second analog input signal value is located.

The particular advantage of the present invention is that the number of conversion steps required for the conversion of the second analog input signal value and the conversion of further analog input signal values also located in the interval is not set by the total conversion width of the analog-digital converter, but by the width of the conversion sub-range. As the conversion sub-range is normally significantly smaller than the total conversion range of the ADC, the present invention allows a significant reduction of the conversion steps.

The reduction of the required conversion steps of a series of measurements leads to a significant reduction of the energy consumption of the ADC. The advantage is particularly effective in applications such as a tire pressure sensor in which, due to different conditions of use, a large total conversion range of the ADC is required, while the sensed measuring values in one condition of use are located only within a small sub-range of the total conversion range of the ADC. The present invention thus allows to reduce the number of conversion steps of an ADC without limiting the application range of the ADC.

One advantage of a hard-wired flow controller implemented by way of logic and registers is that it allows carrying out the method for analog-digital converting independently as pure pressure sensor without the immediate further processing of the pressure data, or permits to relieve a connected calculating unit or computer.

BRIEF DESCRIPTION OF THE DRAWINGS

Preferred embodiments of the present invention are explained in detail in the following with respect to the accompanying drawings, in which:

FIG. 3 is a schematic flow diagram of an analog-digital conversion according to the present invention;

DESCRIPTION OF THE PREFERRED EMBODIMENTS

Figure 1:
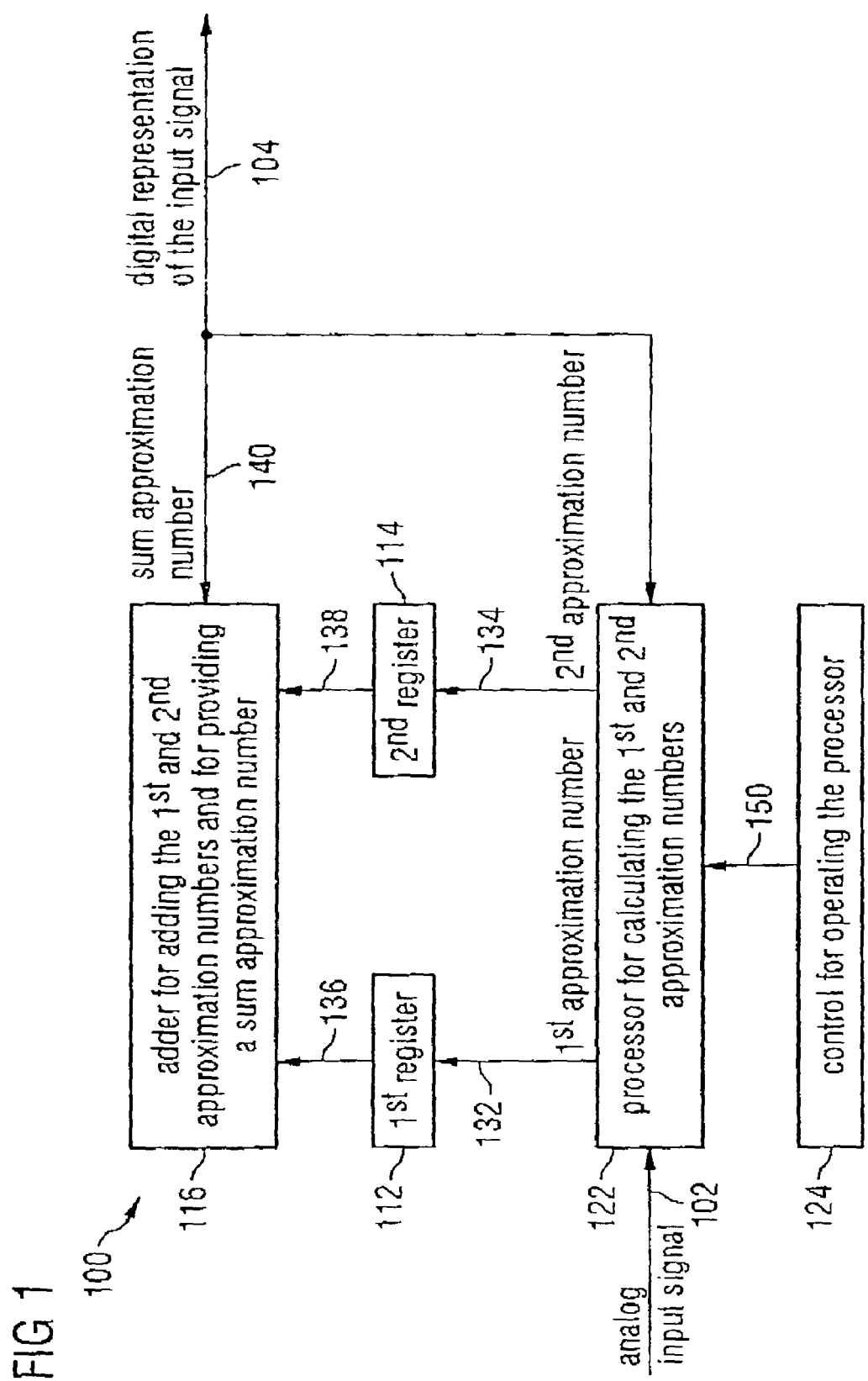
FIG. 1 is a block circuit diagram of an analog-digital converter according to the present invention.

FIG. 1 shows an ADC 100 formed to convert an analog input signal 102 to a digital representation 104 of the analog input signal. The ADC 100 comprises a first register 112, a second register 114, an adder 116, a processor 122 and a controller 124.

The processor 122 is formed to calculate a first approximation number 132 and a second approximation number 134. The first approximation number 132 is held by the first register 112. The second approximation number 134 is held by the second register 114. The registers 112, 114 are connected to the adder 116. The first register 112 provides a held first approximation number 136, and the second register 114 provides a held second approximation number 138 to the adder 116. The adder 116 is formed to add the held approximation numbers 136, 138 and to provide a sum approximation number 140 corresponding to a sum of the held approximation numbers 136, 138. The sum approximation number 140 is returned to the processor 122.

The controller 124 is formed to control operation of the processor 122. For this purpose, the controller 124 provides a control signal 150 to the processor 122.

According to the present invention, the conversion of a first analog input signal 102 is performed in a first conversion cycle, and the conversion of a subsequent analog input signal 102 is performed in a second conversion cycle.

In the first cycle, the first approximation number 132 is variable and the second approximation number 134 is not variable. Thus, during the first cycle, a fixed first value is held in the second register 114. The conversion within a cycle requires several conversion steps. In the first cycle, the processor 122 provides a first approximation number 132 in a first conversion step, which is added with the second held approximation number 138 in the adder 116 as held first approximation number 136 via the first register 112. The obtained sum approximation number 140 is returned to the processor 122 and compared to the analog input signal 102. If they do not match, the processor provides, in a second step, a further first approximation number which delivers a new sum approximation number 140. If the sum approximation number 140 matches the analog input signal 102 after a last conversion step, the sum approximation number 140 is output as digital representation 104 of the input signal by the converter 100. The controller 124 causes the processor 122 via the control signal 150 to write the value of the sum approximation number 140, which corresponds to the digital representation 104 of the analog input signal, as first approximation number 132 into the first register 112 and to hold it there during subsequent conversion cycles. After outputting the digital representation 104 of the input signal and writing the value of the digital representation 104 of the input signal into the first register 112, the first conversion cycle is ended.

In the second cycle, for converting a further analog input signal 102, the first approximation number 132 corresponding to the value of the digital representation 104 of the first analog input signal is held in the first register 112. The processor 122 is formed to adjust, in several conversion steps, the second approximation number 134, which is added as held second approximation number 138 with the fixed held second approximation number 136 in the adder 116 via the second register 114, so that the sum approximation number 140 provided by the adder 116 depends on the analog input signal 102. The sum approximation number 140, in turn, is output as digital representation 104 of the input signal by the converter 100.

After outputting the digital representation 104 of the second analog input signal, the second cycle is ended. In response to a further analog input signal 102, a further second cycle is started. The value of the first approximation number 132 is held unchanged in the first register 112 in further cycles. In further second cycles, the digital representation 104 of the input signal 102 is determined only by an adjustment of the second approximation number 134.

Figure 2:
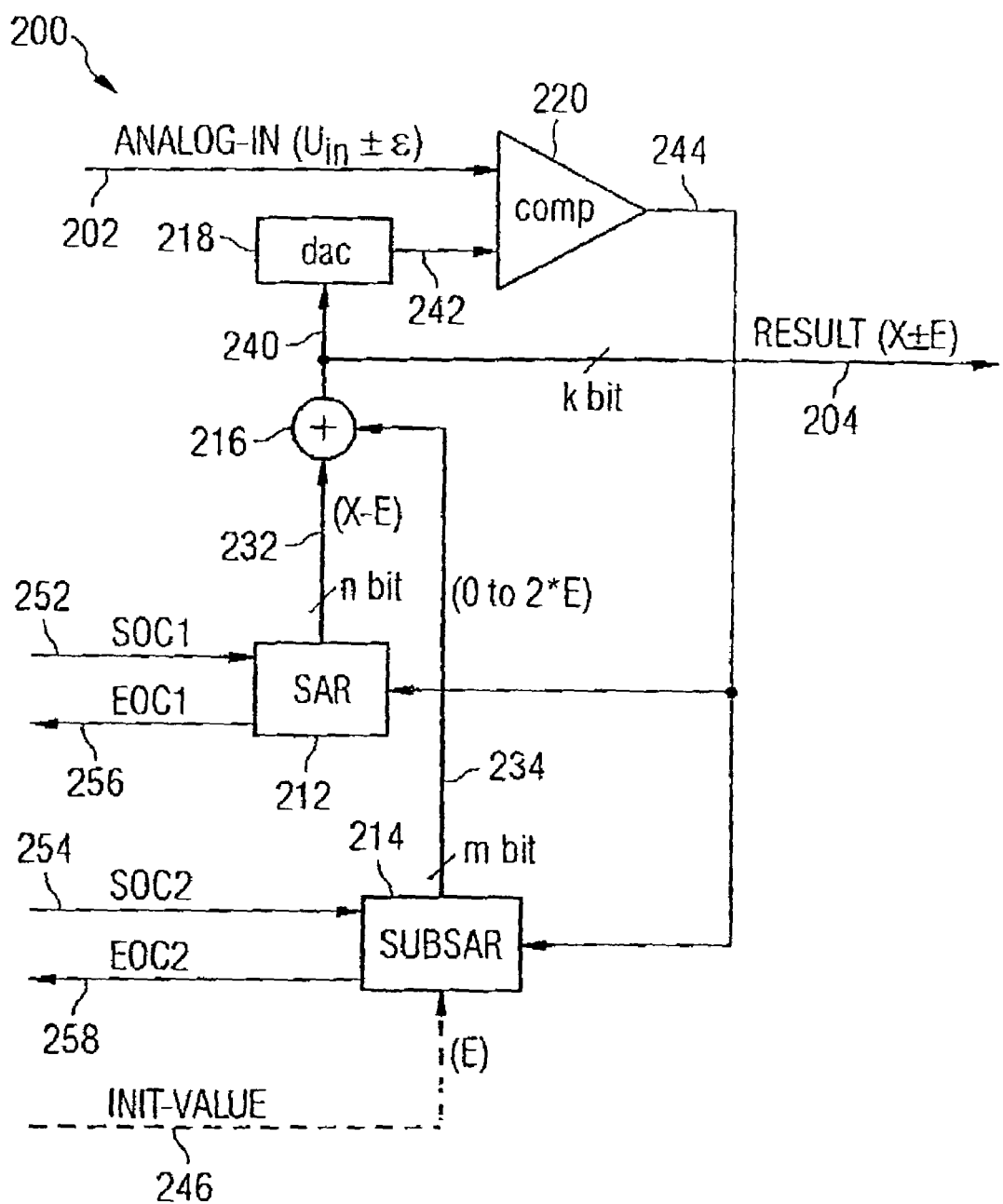
FIG. 2 is a block circuit diagram of an analog-digital converter according to a preferred embodiment of the present invention.

FIG. 2 shows a block circuit diagram of a preferred embodiment of an analog-digital converter 200 according to the present invention. The ADC 200 is formed to convert an analog input signal ANALOG-IN 202 to a digital representation of the input signal in the form of the digital output signal RESULT 204.

The converter 200 comprises a first register in the form of a SAR register 212 according to the prior art, and a second SUBSAR register 214. The SUBSAR register is also a prior art SAR register. Further, the converter 200 comprises an adder 216, a digital-analog converter 218 and a comparator 220.

The SAR register 212 comprises a processor formed to hold a first approximation number 232 in the SAR register 212 and/or provide it to the adder 216. Accordingly, the SUBSAR register 214 comprises a processor formed to hold a second approximation signal 234 and/or provide it to the adder 216.

The adder 216 is formed to add the first approximation number 232 and the second approximation number 234 and to provide a sum approximation signal 240. The sum approximation signal 240 is converted to an analog sum approximation signal 242 in the digital-analog converter 218 and provided to the comparator 220. The comparator 220 is connected both to the analog sum approximation signal 240 and the analog input signal 202 and is formed to provide, in response to a comparison of the input signal 202 with the analog sum approximation signal 240, a comparison value 244 to the SAR register 212 and the SUBSAR register 214.

The registers 212, 214 are connected to a controller (not shown) via control signals SOC1 252, SOC2 254, EOC1 256 and EOC2 258. In addition, the SUBSAR register 214 is connected to a center value INIT-VALUE 246 which presets the fixed initial value of the SUBSAR register 214 in the first conversion cycle by means of SAR register 212.

In this embodiment, the analog input signal 202 represents measuring values of a tire pressure sensor system. Typically, the measuring values of the input signal 202 are within an epsilon environment around a first input value determined by a first measuring value. The measuring values are represented as voltage. The first input value corresponds to the voltage $U_{in}$, and the epsilon environment corresponds to an input voltage variation $\pm\epsilon$. Accordingly, the digital output signal 204 is defined by a value X corresponding to the input voltage $U_{in}$ and a variable sub-range $\pm E$ corresponding to the allowable analog input variation $\pm\epsilon$ and adapted by the center value signal (E) 246.

Figure 5:
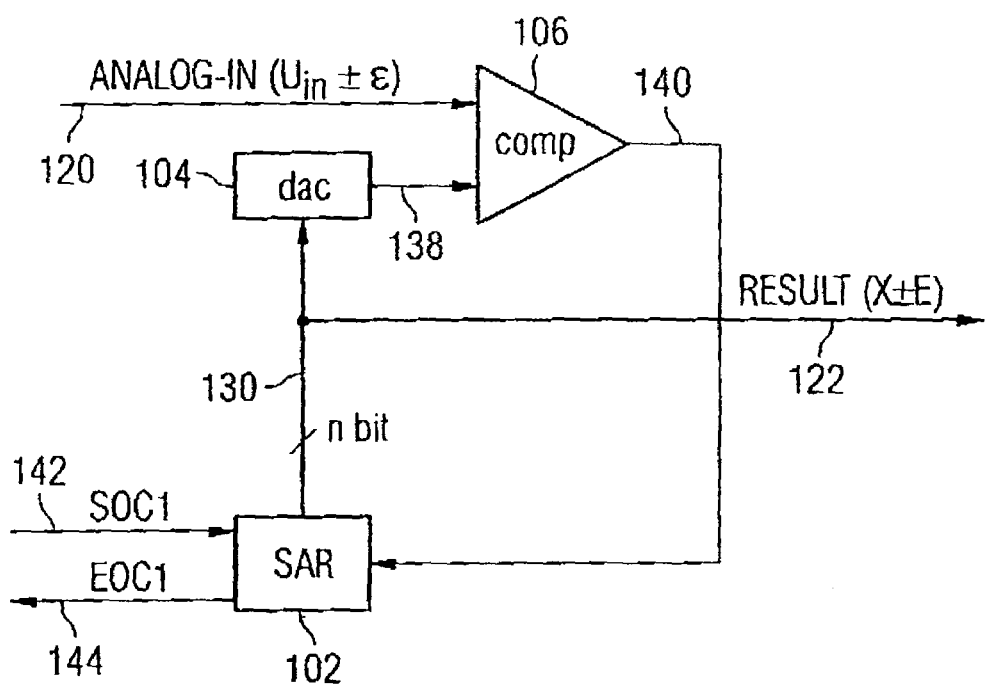
FIG. 5 is a block circuit diagram of a prior art analog-digital converter.

In contrast to the prior art ADC shown in FIG. 5, the present embodiment comprises the SUBSAR block 214 and the adder 216. The ADC 200 comprises a total conversion range within which is the input voltage $U_{in}$. The total conversion range is determined by a conversion width of the digital-analog converter 218. The SAR register 212 is formed so that the first approximation number 232 is a binary number with n bit positions which are sufficient to drive the digital-analog converter 218 so that the analog sum approximation signal 242 covers the total analog conversion range of the converter 200. According to the invention, the SUBSAR register 214 covers a variable sub-range of the total conversion range of the converter 200 which corresponds to the input variation ±ε. The sub-range covered by the SUBSAR register 214 is additively added to the range covered by the SAR register 212 by the adder 216. The digital output signal 204 thus corresponds to a sum of the first approximation number 232 provided by the SAR register 212 and the second approximation number 234 provided by the SUBSAR register 214.

For converting a first analog input signal 202 to a digital output signal 204, a first conversion cycle is started via the control signals 252, 254. During the first cycle, the second approximation number 234 is held, by the SUBSAR register 214, at a fixed value which is provided to the SUBSAR register 214 via the center value signal 246. In this embodiment, the SUBSAR register 214 is set to the value E at the beginning of the first conversion cycle. During the first conversion cycle, the second approximation number 234 thus has the value E. Corresponding to the SAR method described in the prior art, the SAR register 212 sets bits of the first approximation number 232 step-by-step. The adder 216 provides the sum approximation number 240 corresponding to the sum of the first approximation number 232 and the second approximation number 234 having the value E to the digital-analog converter 218. The comparator 220 is formed to compare the analog sum approximation signal 242 provided by the digital-analog converter 218 with the analog input signal 202 and to provide the comparison value 244. According to the SAR method, if the analog sum approximation signal 242 does not match the analog input signal 202, the SAR register 212 provides a new first approximation number 232 in a next step. This step is repeated until the analog sum approximation signal 242 matches the analog input signal 202.

According to the present embodiment, the first measuring value to be converted has the input voltage value $U_{in}$ which corresponds to a digital output signal value 204 X. As the second approximation number 234 is held at the value E during the first cycle, the first approximation number 232 is adjusted to the value X–E during the steps of the SAR method. An addition of the value X–E of the first approximation number 232 X–E with the value E of the second approximation number 234 in the adder 216 results in the value X for the sum approximation signal 240. After a conversion of the sum approximation signal 240 to the analog sum approximation signal 242 with the value $U_{in}$ in a last conversion step by the digital-analog converter 218, the comparator 220 detects a match of the first analog input signal 202 with the value $U_{in}$ and the analog sum approximation signal 242. In response to the match, the controller (not shown) is informed via the EOC1 signal 256 that the sum approximation signal 240 corresponds to the digital output signal 204. The digital output signal 204 with the value X is then output by the ADC 200 at the end of the first cycle.

The first approximation number 232 adjusted at the end of the first conversion cycle, in this embodiment X–E, is held in the SAR register 212 for further conversion cycles. A further analog input value 202 to be converted is converted in a second cycle. Here, the first approximation number 232 remains fixed at the value X–E adjusted in the first cycle. A second digital output signal 204 associated with the second analog input value 202 is calculated by means of the SUBSAR register 214. As the second analog input value 202 is within an epsilon environment around the input value 202 converted in the first cycle, it is sufficient that the SUBSAR register 214 examines only a range corresponding to the epsilon environment by means of the SAR method. According to the SAR method, the SUBSAR register 214 provides second approximation numbers 234 in several steps in the second cycle, which are added with the first fixed approximation number 232. Corresponding to the first cycle, the sum approximation number 240 is converted to the analog sum approximation signal 242 by the digital-analog converter and is compared with the analog second input signal 202 in the comparator 220. In response to a match, the controller (not shown) is informed of a match by the SUBSAR register 214 via the EOC2 signal 258, and the ADC 200 is caused to provide the digital output signal 204 corresponding to the second analog input signal 202. In this embodiment, the analog epsilon environment is represented digitally by the interval ±E. The sub-range covered by the SUBSAR register 214 in the second conversion cycle therefore corresponds to the interval between 0 and 2*E.

In this embodiment, the analog input signal 202 corresponds to the input voltage $U_{in}+\epsilon$ during the second conversion cycle. Thus, the second approximation number 234 has the value 2*E at the end of the second conversion cycle. As the first approximation signal 232 has the value X–E, the sum of the first approximation signal 232 with the value X–E and the second approximation number 234 with the value 2*E results in the digital output value X+E corresponding to the analog input voltage $U_{in}+\epsilon$.

During the first cycle, the second approximation number 234 was held at the value E by the center value signal 246. The value E corresponds to one half of the sub-range width 2ε. Thereby, after a conversion of the first analog input signal 202 with the SAR register 212 in the first cycle, both a coverage of a positive and a negative range by the SUBSAR register 214 is possible in the subsequent second cycles. The value to be covered results from X–E+0=X–E to X–E+2*E=X+E. If the second approximation number 234 was set to 0 during the first cycle, only positive changes of the input voltage could subsequently be considered during the second cycles.

The second approximation number is a binary number with m bits. The number of the bits of the second approximation number 234 determines how large is the input variation of the analog input signal 202 that can be sensed by the converter 200. The number of the bits m of the second approximation number is chosen corresponding to the requirements of an application example. Preferably, however, the bit width m of the second approximation number is smaller than the bit width n of the first approximation number.

After converting a first input signal 202, the ADC 200 requires m steps for a conversion of each further input signal 202. For a conversion of a series of measurements of r analog input signal values, the case m<n results in saving (n−m)*r steps with constant accuracy.

According to a further embodiment, the analog input signal values are located unsymmetrically around a first analog input signal value converted during the first cycle. Such an unsymmetrical division is taken account of, according to the invention, by not setting the second approximation number to a value corresponding to one half of the variation width of the input signal during the first conversion cycle, but to a correspondingly higher or lower value.

According to a further embodiment, the SAR register and the SUBSAR register comprise overflow/underflow flags. The flags help to determine whether analog input signal values are outside the epsilon environment. Thus, converting errors are avoided and the input range of the converter may be regulated. This is possible by carrying out a subsequent conversion cycle as a first conversion cycle after the occurrence of an overflow/underflow error in the SUBSAR register, changing the number of the bits n, m of the approximation signals or providing the analog input signal with an offset (not shown).

According to a further embodiment, the digital-analog converter is implemented with an additional bit in the input range, so that the total conversion range of the ADC is extended by the SUBSAR range.

FIG. 3 shows a flow diagram of a method for converting an analog sampling value to a digital output value, which may be implemented on the converter shown in FIG. 2. At the beginning 300 of a first cycle, a first analog sampling value is provided and a fixed value is loaded into a SUBSAR register.

For converting the first analog sampling value to a first digital output value 300', a value for a SAR register is calculated in a first calculation step 302. The calculation 302 of the value is carried out according to the SAR method and usually requires a series of sub-steps (not shown) including an addition of the SAR value with the fixed SUBSAR value and a comparison of the sum of both values with the first sampling value. After the calculation 302 of a SAR value, an addition 304 of the SAR value and the SUBSAR value and an output of the first output value 300' corresponding to a digital representation of the first analog sampling value are performed.

The first cycle is completed by fixedly storing 306 the calculated SAR value in the SAR register.

A second analog sampling value is provided at the beginning 308 of a second cycle. Subsequently, a SUBSAR value is calculated 310. The calculation 310 of the SUBSAR value normally includes a plurality of sub-steps (not shown) in which the calculated SUBSAR value is added with the fixed SAR value and is compared with the second sampling value. Again, the procedure corresponds to the SAR method. After the calculation 310 of a SUBSAR value, the SUBSAR value is added 312 with the SAR value and a second output value 302' representing a digital representation of the second analog sampling value is output. In this embodiment, after completion of the second cycle, an overflow/underflow control is performed 314. This control helps to determine whether the second sampling value is within a specified interval. If no overflow/underflow has occurred, a further second cycle is started 308 by providing a further sampling value. If, however, an overflow/underflow is detected, a new initialization is performed by a beginning 300 of a first cycle.

Figure 4A:
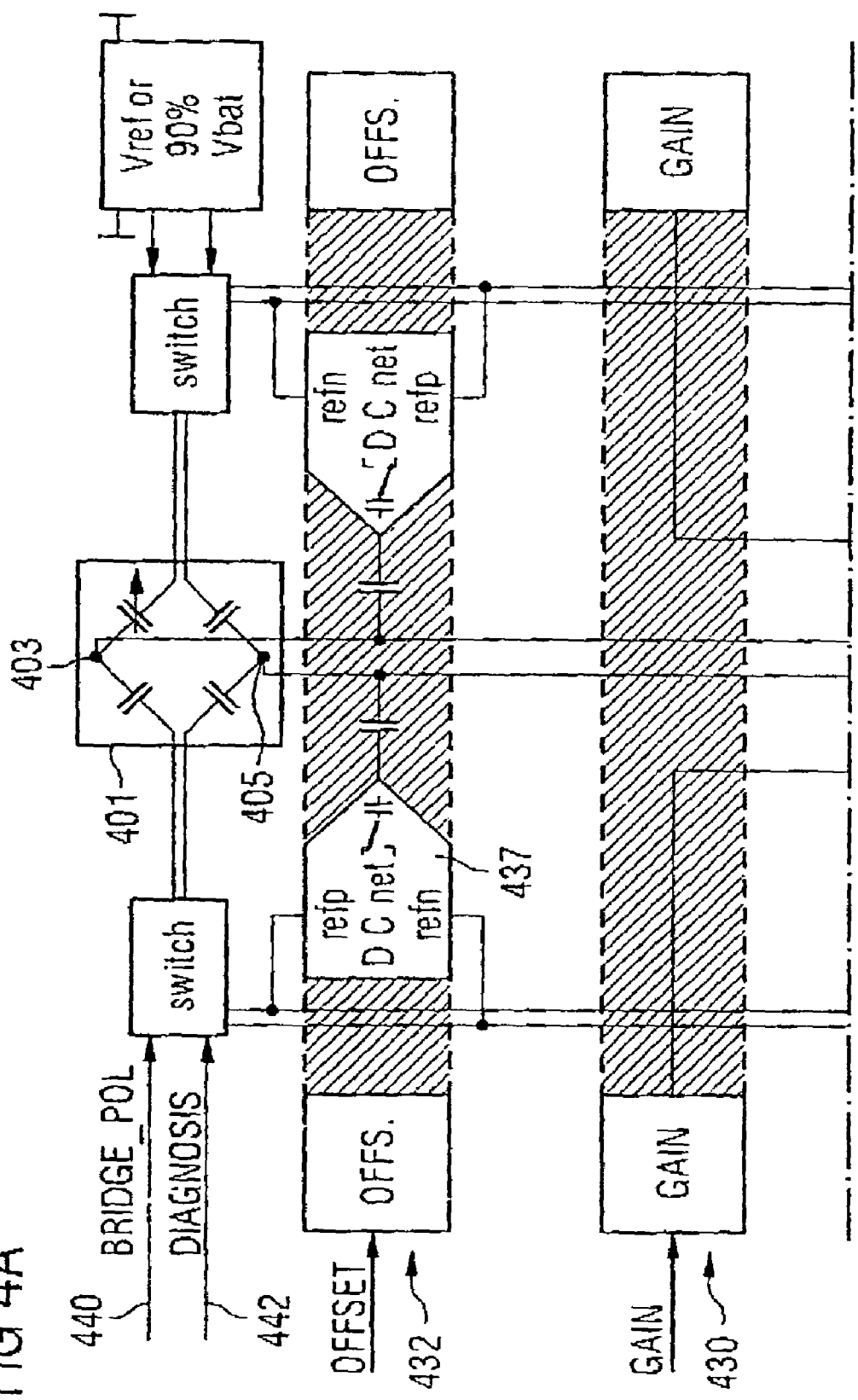
FIG. 4 is a block circuit diagram of a tire pressure sensor according to the present invention.
Figure 4B:
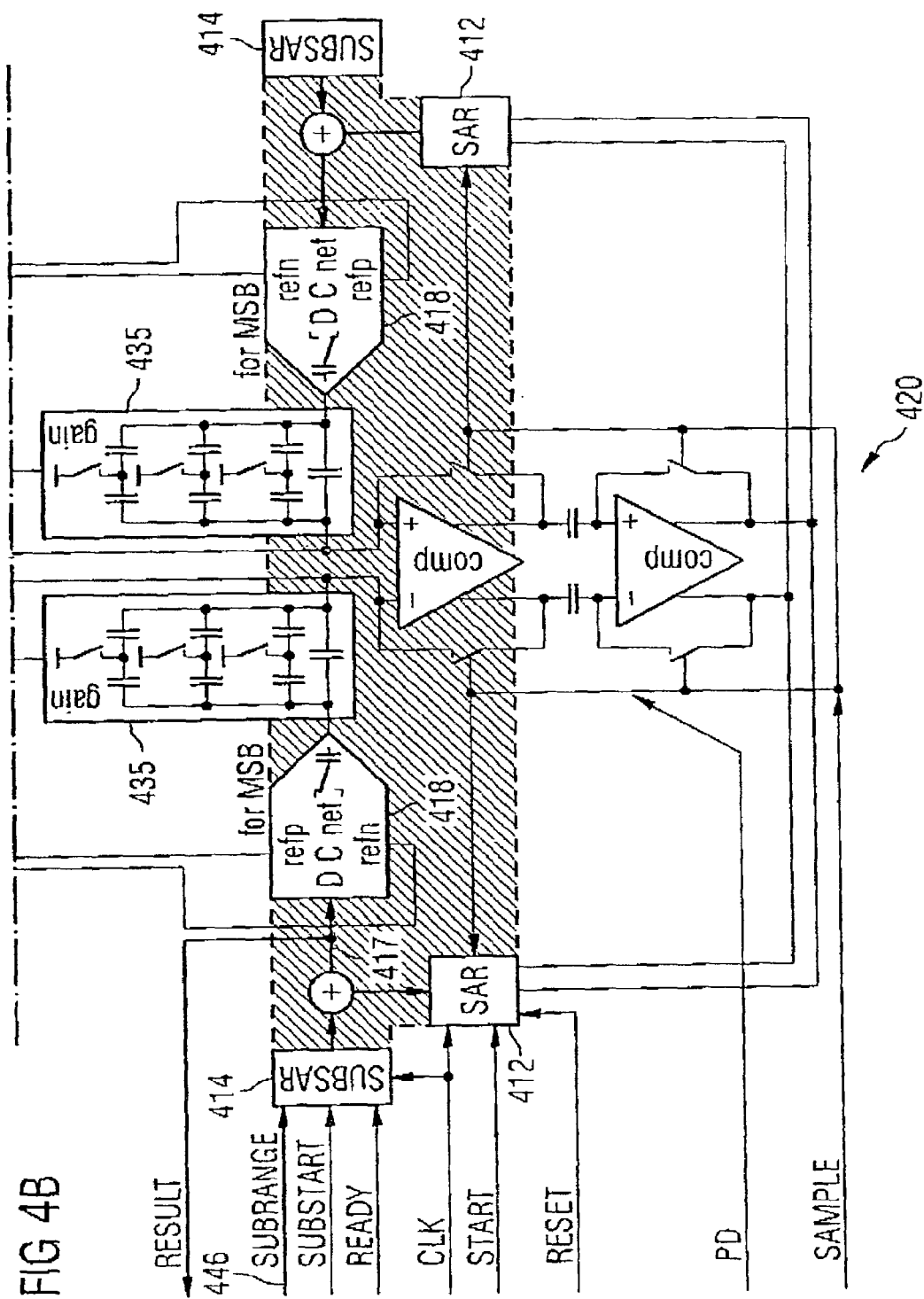

FIG. 4 shows a block circuit diagram of a tire pressure monitoring sensor comprising an analog-digital converter according to the present invention.

The tire pressure sensor 400 comprises a pressure sensor measuring bridge 401 with a first 403 and a second 405 center node, and an analog-digital converter. The converter comprises a SAR register 412, a SUBSAR register 214 and an adder 416. Corresponding to the above embodiments, the SAR values and the SUBSAR values are calculated and added in the adder 416 which provides a sum approximation signal 417. After a conversion cycle is ended, the sum approximation signal 417 is output as digital representation RESULT of the tire pressure sensed by the measuring bridge 401.

In this embodiment, a charge balancing is carried out instead of an approximation of a voltage as in the above embodiments.

For this, the sum approximation signal 417 controls capacitances in a capacitance network 418, which are connected in parallel to a first or a second bridge branch of the measuring bridge 401. A resulting change in charge causes a change in potential at the first 403 and second 405 center nodes of the measuring bridge 401. The center nodes 403, 405 are tapped off by a multi-stage difference amplifier 420, and a sensed comparison value is provided to the SAR register 214. In this embodiment, the difference amplifier 420 comprises several comparator stages.

The tire pressure sensor 400 comprises a GAIN 430, an OFFSET 432 structure, with which production tolerances are corrected by static parallel and series connection of capacitances 435, 437 to the capacitance network 418.

The measuring bridge 401 is changed in polarity with each measurement via the signal BRIDGE_POL 440. With a diagnosis input 442, both reference capacitances and both sensor capacitances may also be connected in parallel for detecting a defect.

Another special feature of this embodiment is that the tire pressure measurement is carried out differentially to double a present signal swing and also, among other things, improve the interference immunity. For this purpose, the registers 412, 414 correspondingly also drive two capacitance networks 418 for the first and second measuring bridge halves. Unlike the above embodiments in which a single-ended SAR was employed, a differential SAR is employed in this embodiment.

A center value of the SUBSAR register is adjusted via a SUBRANGE signal 246 according to the embodiment shown in FIG. 2.

Depending on the circumstances, the inventive analog-digital conversion method may be implemented in hardware or software. The implementation may be carried out on a digital storage medium, particularly a floppy disk or CD with control signals that may be read out electronically, which may cooperate with a programmable computer system so that the corresponding method is carried out. Generally, the invention thus also consists in a computer program product with a program code stored on a machine-readable carrier for carrying out the inventive method when the computer program product runs on a computer. In other words, the invention may thus be realized as a computer program with a program code for carrying out the method when the computer program runs on a computer.

It is to be understood that a flow control and/or finite state machine for analog-digital converting may also be implemented in pure hardware without using resources of a computer or microprocessor. In the case of such an independent ADC, further processing is carried out externally. In a TPMS sensor (TPMS=Tire Pressure Monitoring Sensor), the flow control may be carried out in a separate hardware block which is independent of a programmable controller. Alternatively, the flow control may also be carried out by the controller.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An analog-digital converter comprising:
    a first register for holding a first approximation number which is variable in a first cycle and is fixed in a second cycle;
    a second register for holding a second approximation number which is fixed in the first cycle and is variable in the second cycle;
    an adder for adding the first and second approximation numbers and for providing a sum approximation number representing a digital representation of an analog input signal;
    a processor for calculating the first approximation number, the processor being formed to adjust the first approximation number in the first cycle in response to the analog input signal so that the sum approximation number depends on the analog input signal, and for calculating the second approximation number, the processor being formed to adjust the second approximation number in the second cycle in response to the analog input signal so that the sum approximation number depends on the analog input signal; and
    a controller for operating the processor in the first or second cycle.

2. The analog-digital converter of claim 1, wherein the processor comprises a digital-analog converter for converting the sum approximation number to an analog sum approximation number signal, and a comparator for comparing the sum approximation number signal with the analog input signal and for providing a comparison result.

3. The analog-digital converter of claim 1, wherein the second cycle follows the first cycle.

4. The analog-digital converter of claim 1, wherein the first approximation number is a binary number with n bit positions and the second approximation number is a binary number with m bit positions.

5. The analog-digital converter of claim 4, wherein the processor adjusts the first and second approximation numbers via an iteration method whose number of iteration steps is determined, in the second cycle, by the number of the bit positions of the second approximation number.

6. The analog-digital converter of claim 1, wherein the processor comprises a unit for loading the second approximation number into the second register at the beginning of the first cycle.

7. The analog-digital converter of claim 1, further comprising a monitor for monitoring the first register or the second register, formed to adapt pre-settings of the analog-digital converter in response to an overflow or underflow of a register so that an overflow or underflow is avoided.

8. The analog-digital converter of claim 1, wherein the first register and the second register is a SAR register.

9. A tire pressure sensor comprising an analog-digital converter according to claim 1, and further comprising:
    a unit for sensing a tire pressure and for providing an analog tire pressure sensing value wherein the analog tire pressure sensing value is fed to said analog-digital converter.

10. A method for converting an analog input signal to a digital output signal, comprising the steps of:
    providing a first sampling value of an analog input signal, and loading a first fixed value into a second register;
    calculating a first value of a first register so that a sum of the first values of the first and second registers depends on the analog input signal;
    forming a first sum of the first values of the first and second registers, and outputting the first sum as a first digital output signal;
    fixedly storing the first value of the first register in the first register;
    providing a second sampling value of the analog input signal;
    calculating a second value of the second register so that the sum of the first value of the second register and the second value of the second register depends on the analog input signal; and
    forming a second sum of the first value of the first register and the second value of the second register depending on the analog input signal.

11. A hard-wired flow controller comprising corresponding logic and registers, or a flow and/or calculating unit with fixed coding, the hard-wired flow controller being operable to carry out the method of converting an analog input signal to a digital output signal according to claim 10.

12. A computer program with a program code stored on a computer readable medium for carrying out the method of converting an analog input signal to a digital output signal, executable on a computer, the computer program comprising instructions for providing a first sampling value of an analog input signal, and for loading a first fixed value into a second register; for calculating a first value of a first register so that a sum of the first values of the first and second registers depends on the analog input signal; for forming a first sum of the first values of the first and second registers and for outputting the first sum as a first digital output signal; for fixedly storing the first value of the first register in the first register; for providing a second sampling value of the analog input signal; for calculating a second value of the second register so that the sum of the first value of the second register and the second value of the second register depends on the analog input signal; and for forming a second sum of the first value of the first register and the second value of the second register depending on the analog input signal.

* * * * *